(12) United States Patent
Boemler

(10) Patent No.: US 7,061,413 B2
(45) Date of Patent: Jun. 13, 2006

(54) ANALOG TO DIGITAL CONVERSION WITH OFFSET CANCELLATION

(75) Inventor: Christian Boemler, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/925,171

(22) Filed: Aug. 25, 2004

(65) Prior Publication Data

US 2006/0055576 A1    Mar. 16, 2006

(51) Int. Cl.
H03M 1/10    (2006.01)
H03M 1/12    (2006.01)

(52) U.S. Cl. .................. 341/120; 341/172
(58) Field of Classification Search ........... 341/118, 341/120, 155, 161, 162, 169, 172, 128, 143; 250/208.1; 327/93
See application file for complete search history.

(56) References Cited

U.S. PATENT DOCUMENTS

| | | | | |
|---|---|---|---|---|
| 5,101,206 A | * | 3/1992 | Riedel | 341/156 |
| 5,668,551 A | * | 9/1997 | Garavan et al. | 341/120 |
| 5,793,322 A | * | 8/1998 | Fossum et al. | 341/161 |
| 5,880,691 A | * | 3/1999 | Fossum et al. | 341/162 |
| 5,929,800 A | * | 7/1999 | Zhou et al. | 341/161 |
| 6,087,970 A | | 7/2000 | Panicacci | 341/172 |
| 6,147,522 A | * | 11/2000 | Rhode et al. | 327/93 |
| 6,307,195 B1 | * | 10/2001 | Guidash | 250/208.1 |
| 6,384,760 B1 | * | 5/2002 | Fuhrman | 341/128 |
| 6,433,713 B1 | * | 8/2002 | Fuhrman | 341/120 |
| 6,567,028 B1 | * | 5/2003 | Huang et al. | 341/155 |
| 6,570,519 B1 | * | 5/2003 | Yang | 341/143 |
| 6,753,801 B1 | * | 6/2004 | Rossi | 341/161 |
| 6,885,331 B1 | * | 4/2005 | Krymski | 341/169 |
| 6,970,126 B1 | * | 11/2005 | O'Dowd et al. | 341/172 |

* cited by examiner

Primary Examiner—Patrick Wamsley
(74) Attorney, Agent, or Firm—Dickstein Shapiro Morin & Oshinsky LLP

(57) ABSTRACT

An analog to digital conversion circuit includes a voltage-to-charge converter coupled to a charge integrator and a comparator. The voltage-to-charge converter is coupled to, and converts the voltage of, an analog signal or one of a set of reference voltages, into an equivalent charge. The charge integrator then adds or subtracts that equivalent charge in an iterative manner based on an output of the comparator. The initial charge of the charge integrator is based on a previous conversion. When plural analog to digital conversion circuits are used the initial charge in each such circuit may be different, as each initial charge serves to automatically compensate for any offset in the output of the circuit.

43 Claims, 7 Drawing Sheets

ANALOG TO DIGITAL CONVERSION WITH OFFSET CANCELLATION

FIELD OF INVENTION

The present invention relates generally to analog-to-digital conversion, and can be used in an semiconductor imager having a column-parallel architecture. It should be noted however, that the invention may also be practiced in other environments.

BACKGROUND OF THE INVENTION

FIG. 1 is a block diagram of an imager 100. The imager 100 includes a plurality of pixels 102 for sensing a level of incident light. The pixels 102 are arranged into rows and columns to form a pixel array 101. Each pixel 102 produces an indication of the level of incident light in the form of two signals, namely, a reset signal Vrst and a photo signal Vsig.

The imager 100 also includes a timing and control circuit 150. The timing and control circuit 150 operates a row decoder 120, row driver 110, column decoder 170, a column memory 165, and a column parallel analog to digital converter (ADC) 160. The row decoder 120 and row driver 110 are operated to select a row within the pixel array 101. The column parallel ADC 160 is operated to receive pixel signals from the row selected by the row decoder 120 and driver 110. The column parallel ADC 160 samples and stores the pixel output signals Vrst and Vsig and, for each pixel in the selected row, subtracts them to form an analog pixel signal (Vrst−Vsig), and produces a equivalent digital value, which is stored in the column memory 165. The column parallel ADC 160 supplies these digital values in sequence to the image processor 180. The image processor 180 may perform additional processing operations on the digital signals such as, for example, color correction, and provides an image output. The output of the image processor 180 is routed to an output circuit 190, which can output the processed result to a storage device, screen, or printer.

Existing circuits for storing and digitizing pixel signals are relatively complex, making designs using existing circuits difficult to economically scale the existing design to large pixel arrays. Additionally, when the existing circuits are replicated, each circuit may exhibit an offset in its output, resulting in fixed pattern noise. Accordingly, there is a need for a more efficient circuit for receiving and digitizing pixel signals. Additionally, there is a need for such a circuit to be capable of automatically calibrating its output in order to minimize fixed pattern noise.

SUMMARY OF THE INVENTION

Exemplary embodiments of the invention provide a method and apparatus for storing and digitizing signals, for example, pixel signals provided by an imager. One exemplary embodiment includes a voltage-to-charge converter coupled in series with a charge integrator, which in turn is coupled in series with a comparator. The voltage-to-charge converter is coupled to, and converts the voltage of, either an analog signal or one of a set of reference voltages, into an equivalent charge. As described below, the analog signal may be a pixel signal produced by a pixel in an imager, but it should be recognized that the principles of the present invention are applicable in any situation which requires analog to digital conversion. The charge integrator adds or subtracts the equivalent charge in an iterative manner based on the output of the comparator. The initial charge in the charge integrator is based on a previous conversion. When multiple analog to digital converters are used, the initial charge in each analog to digital converter may be different, in order to compensate for any offset present in the output of each one of the analog to digital converters.

BRIEF DESCRIPTION OF THE DRAWINGS

The foregoing and other advantages and features of the invention will become more apparent from the detailed description of exemplary embodiments of the invention given below with reference to the accompanying drawings, in which.

DETAILED DESCRIPTION OF THE INVENTION

Figure 1:
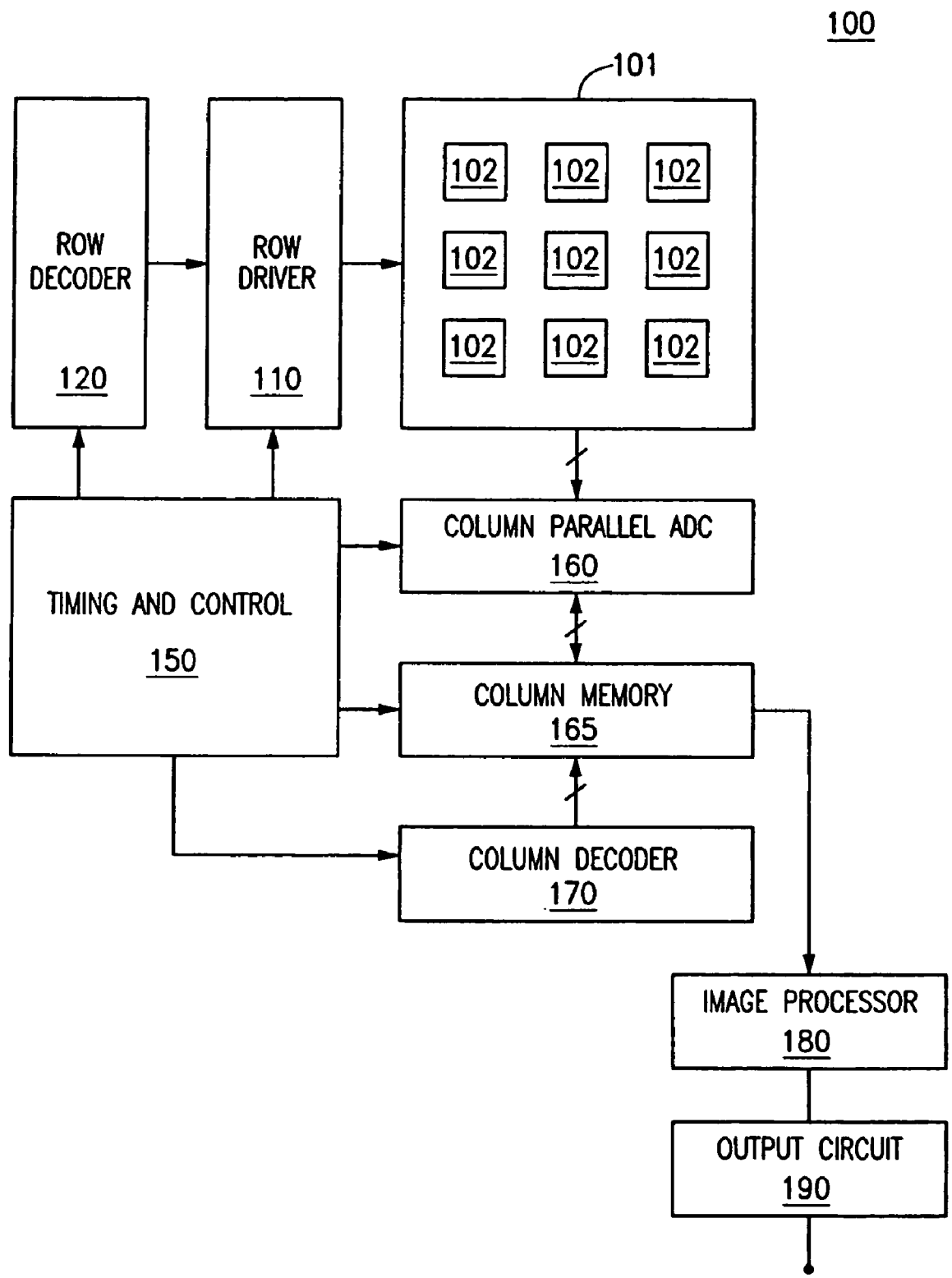
FIG. 1 illustrates an imager.
Figure 2:
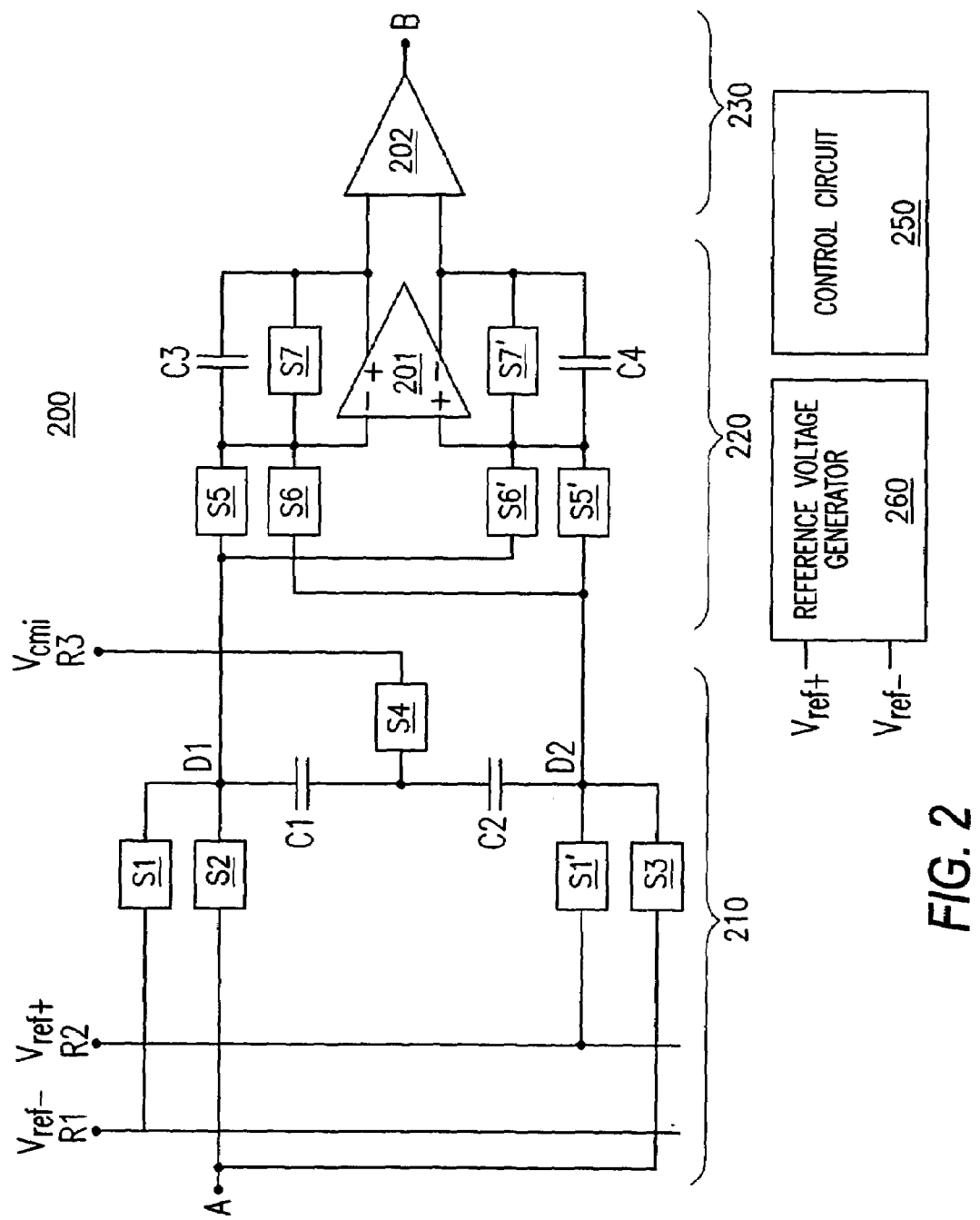
FIG. 2 illustrates a first embodiment of the circuit of the present invention.

Now referring to the drawings, where like reference numerals designate like elements, there is shown in FIG. 2 a circuit 200 for storing and digitizing pixel signals. In one exemplary embodiment of the present invention, the column parallel ADC 160 (FIG. 1) includes a plurality of circuits 200. More specifically, the column parallel ADC 160 may include an equal number of circuits 200 as there are columns in each row of the pixel array 101. The circuit 200 accepts pixel signals, i.e., a reset signal Vrst and a photo signal Vsig at alternate times at node A. The circuit 200 outputs a digital representation of the pixel signals at node B. The circuit 200 also accepts reference voltages Vref−, Vref+, and a common mode voltage Vcmi respectively at nodes R1, R2, and R3. The circuit 200 can be viewed as three circuits 210, 220, and 230 coupled in series.

Circuit 210 is a voltage-to-charge converter. The voltage-to-charge converter 210 accepts the reset Vrst and photo Vsig signals at node A and stores charge corresponding to the reset signal Vrst on capacitor C1 and charge corresponding to the photo signal Vsig on capacitor C2. As shown in FIG. 2, switches S1–S4 and S1' can be controlled to determine which signals are routed to the capacitors C1, C2.

Circuit 210 operates by initially setting capacitors C1 and C2 to a default level of charge. More specifically, either switches S1 or S3 are closed while switch S4 is closed. Switch S4 is a crowbar switch, which when closed couples the inner plates of capacitors C1, C2 to node R3, which is coupled to a source of a common mode voltage Vcmi. The purpose of the crowbar is to common mode center the Vsig−Vrst signal, which otherwise has a common mode component proportional to Vsig. In one exemplary embodiment the Vcmi voltage is half of the supply voltage, i.e., Vdd/2. However, it should be evident that the common mode voltage Vcmi can be other values without departing from the scope of the invention.

After switch S4 is closed, the reset Vrst and photo Vsig signals are respectively coupled, at different times, to capacitors C1 and C2. More specifically, when the reset signal Vrst is present at node A, switches S2 and S4 are closed while switches S1 and S3 are open. This couples the outer plate of capacitor C1 to the reset signal Vrst via node A and the inner plate to Vcmi. The charge on capacitor C1 is therefore changed based on the difference between the reset signal Vrst and Vcmi. Switch S2 is then opened. When the photo signal Vsig is present at node A, switches S3 and S4 are closed while switches S1 and S2 are open. This couples the outer plate of capacitor C2 to the photo signal Vsig via node A and the inner plate to Vcmi. The charge on capacitor C2 is therefore changed based on the difference between the photo signal Vsig and Vcmi. Switches S3 and S4 are then opened. The voltage difference between nodes D1 and D2 is identical to the difference between Vrst and Vsig. When switch S4 is opened, this difference is unmodified, but the common mode signal equal to the average of the reset Vrst and photo Vsig signals will change to a voltage near Vcmi when connected to the integrator 220.

Switches S1, S1' are used to respectively couple the reference voltages Vref− and Vref+ to capacitors C1 and C2. Switches S1, S1' can be opened when no signal is present at node A to respectively change the charge level on capacitors C1 and C2 based on the level of the reference voltages Vref− and Vref+. In one exemplary embodiment, the reference voltages Vref− and Vref+ are each offset from the common mode voltage Vcmi by equal magnitude and opposite polarity. As explained below, the magnitude of this offset of the reference voltages Vref− and Vref+ is controlled by an external reference voltage generator, and varies during the operation of the circuit 200.

Circuit 220 is a charge integrator. The inputs of the charge integrator 220 are at nodes D1 and D2. Significantly, node D1 is coupled to capacitor C1 and node D2 is coupled to capacitor C2. The charge integrator 220 includes a differential amplifier 201 and switches S5, S6, and S7. In one exemplary embodiment, the differential amplifier 201 is an operational amplifier. However, the differential amplifier 201 can be implemented using other devices without departing from the scope of the present invention. The charge integrator 220 also includes capacitors C3 and C4. The capacitors C3 and C4 are configured to form feedback loops for the differential amplifier 201. The switches S5, S5', S6, and S6' can be set to respectively couple capacitors C3 and C4 to capacitors C1 and C2. Alternatively, switches S5, S5', S6, and S6' can instead couple capacitors C3 and C4 to C2 and C1 if desired.

The charge integrator 220 is used to add or subtract charge from a state stored as a charge. The charge integrator 220 is initialized by closing switches S7, S7' while switches S5, S5', S6, and S6' are open. This causes the differential amplifier 201 to output a default signal. The default signal should be a differential signal corresponding to a zero signal. That is, both components of the differential signal should be the common mode voltage Vcmi. However, the outputs of the differential amplifier 201 and comparator 202 may include an offset voltage in addition to kTC noise on capacitors C3 and C4. Thus, the differential signal output by the amplifier 201 during initialization may differ slightly from the expected zero signal.

As previously noted, the states of switches S5 and S6 can be controlled to determine whether capacitors C3 and C4 are respectively coupled to capacitors C1 and C2, or respectively coupled to capacitors C2 and C1. When switches S5, S5' are closed and switches S6, S6' are open, the charge integrator 220 adds the charge at nodes D1 and D2 respectively to the charge on capacitors C3 and C4. When switches S5, S5' are open and switches S6, S6' are closed, the charge integrator 220 subtracts the charge at nodes D1 and D2 respectively from the charge on capacitors C3 and C4.

The third portion 230 of circuit 200 is a comparison portion. The comparison portion 230 includes a comparator 202. Comparator 202 is preferably a latching comparator. The comparator 202 has its inputs coupled to the outputs of the differential amplifier 201 and has an output that is coupled to node B.

Now that the basic operation of each portion 210, 220, and 230 of circuit 200 has been described, the operation of the entire circuit 200 in receiving and digitizing pixel signals is now explained. First, it should be noted that circuit 200 is designed to be operated in an iterative manner by sequencing switches S1–S7' as described below. Preferably, a control circuit 250 is coupled to and operates each switch S1–S7'. Further, a reference voltage generator 260 is also used to generate a sequence of reference voltages Vref−, Vref+ as described below. The reference voltage generator 260 can also be controlled by the control circuit 250. Alternatively, the control circuit 250 can be a part of the control circuit 150 (FIG. 1) of the imager 100.

Figure 3:
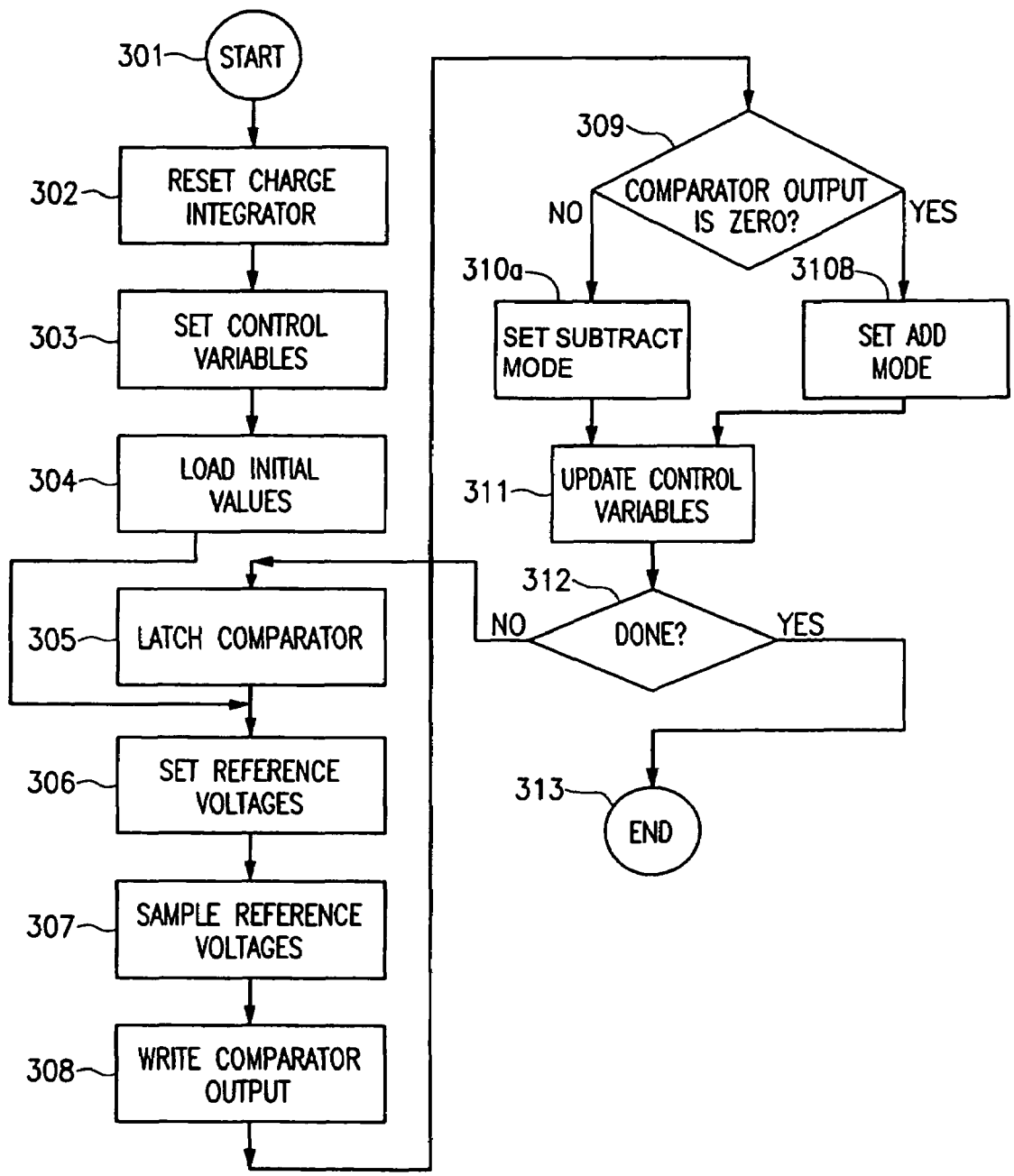
FIG. 3 is a flowchart illustrating the operation of the circuit of FIG. 2.

Now also referring to FIG. 3, the process 300 for operating the circuit 200 is explained. The process begins at step 301 and ends at step 313, after an iterative process explained below. Each iteration produces one bit of the analog-to-digital conversion. Each successive iteration produces the next less significant bit of the analog-to-digital conversion. The process begins at step 301 and jumps directly to step 302.

At step 302, the charge integrator 220 is reset. As previously described, this is performed by temporarily closing switch S7 while switches S1–S6' are open. As a result, the differential amplifier 201 outputs a default differential signal. The default differential signal is supposed to correspond to a zero level signal, but as previously explained, there may be an offset voltage that causes the charge integrator 220 to output a non-zero signal as a default signal. The default differential signal is supplied to comparator 202, which produces an output at node B.

At step 303, the variables used by the control circuit to sequence switches S1, S1', S2–S4, S5, S5', S6, S6', S7, and S7' are initialized. In one exemplary embodiment, the control circuit initializes two control variables. A control variable BitCntr is initialized to the number of bits of resolution of the analog-to-digital conversion. For example, if the circuit 200 produces an 8-bit digital word, the BitCntr variable is initialized to 8. A variable RefLevel is initialized to control the output of the reference voltages Vref−, Vref+. The initial value of RefLevel is set so that the external reference voltage level generator generates the reference voltages Vref−, Vref+ as corresponding to the full scale voltage. The process 300 continues at step 304.

At step 304, capacitors C1 and C2 are loaded with their initial values. For example, when a reset signal Vrst is present at node A, switches S2 and S4 can be temporarily closed while switches S1, S1', and S3 are opened. This couples node A with the outer plate of capacitor C1. Similarly, when a photo signal Vsig is present at node A, switches S3 and S4 can be temporarily closed while switches S1, S1', and S2 are opened. This couples node A with the outer plate of capacitor C2. Accordingly, capacitors C1 and C2 are loaded with the initial analog values, which will be converted to corresponding digital values. These values are then respectively conveyed to capacitor C3 and C4 when switch S5 is temporarily closed while switches S1, S2, S3, S4, S6, and S7 are open.

At step 306, the control circuit 250 causes an reference voltage generator 260 to set an appropriate voltage for the reference voltages Vref–, Vref+. In one exemplary embodiment, the control circuit causes the reference voltage generator 260 to set the reference voltages so that a differential signal formed by the two reference voltages Vref–, Vref+ has a value proportional to the value of the RefLevel control variable.

At step 307, the reference voltages Vref–, Vref+ are sampled onto capacitors C1 and C2. More specifically, the control circuit causes switches S1, S1' to temporarily close while switches S2 and S3 are open. Switch S4 can either be open or closed during this operation. A closed S4 will remove common mode errors in the reference voltage signal, whereas an open S4 will create less kTC noise and cause a undetermined voltage on the inner plates of capacitors C1 and C2. The reference voltage Vref–, Vref+ are respectively supplied to capacitors C1, C2 via nodes D1, D2. As a result, the charge stored in capacitors C1, C2 are respectively changed based on the signal levels of the reference voltages Vref–, Vref+.

At step 308, charges stored on capacitors C1 and C2 are shared with capacitors C3 and C4, based upon the states of switches S5, S5', S6, and S6'. As explained below with reference to steps 310a and 310b, the states of switches S5, S5', S6, and S6' are set to correspond to either an "add" or "subtract" mode. For the first loop iteration, switches S5, S5', S6, and S6' are configured for the "subtract" mode; thus switches S5, S5' are open while switches S6, S6' are closed. Thus, charge from capacitor C1 is integrated into capacitor C4 and charge from capacitor C2 is integrated into capacitor C3. The differential amplifier 201 thus produces outputs based on the previous charges on capacitors C3 and C4 in addition to the charges on C1 and C2. These outputs are supplied to the comparator 202, which outputs a bit at node B. During the first iteration this output bit is the most significant bit of the analog-to-digital conversion. During each successive iteration, the output bit is the next most significant bit. The process 300 continues at step 309. The output bit at node B is typically written to a storage device, such as a memory or a register.

At step 309, the comparator output is compared to zero. Process 300 continues at step 310a if the comparator output is not zero. Process 300 continues at step 310b if the comparator output is zero.

At step 310a, the control circuit is configured to set switches S5, S5', S6, and S6' to operate in the subtract mode for the next iteration. That is, the control circuit will cause switches S5, S5' to close and switches S6, S6' to open in step 308 during the next iteration. Alternatively, in step 310b, the control circuit is configured to set switches S5, S6 to operate in the add mode for the next iteration. That is, the control circuit will cause switch S5 to open and S6 to close in step 308 during the next iteration. Process 300 continues at step 311 regardless of whether steps 310a or 310b were executed.

At step 311, the control circuit updates its control variables. In one exemplary embodiment, the BitCntr control variable is decremented by one and the RefLevel control variable is divided by two. In this manner, the BitCntr control variable is used to count a number of bits remaining to be converted by the circuit 200. Further, the value of RefLevel is used to control the reference level voltages by dividing the magnitude of the signal formed by the reference voltages Vref+, Vref– by half on each iteration. The process 300 continues at step 312.

At step 312, the control circuit checks to see if the conversion process 300 has completed. In one exemplary embodiment, if the BitCntr variable is zero, the conversion is complete, and the process ends at step 313. Alternativley, if BitCntr is not zero, the process 300 continues at step 305.

In step 305, the comparator 303 output at node B is latched. After step 305, the process begins a new iteration by executing step 306.

Thus, circuit 200 operates in an iterative manner. In each iteration, a charge related to a reference voltage level one half in magnitude of the reference voltage level of the previous iteration is either added to or subtracted from the charge stored on capacitors C3 and C4. When process 300 terminates at step 313, no charge should be present on capacitors C3, C4. However, due to possible offset errors in the differential amplifier 201 and/or comparison error in the comparator 202, there may be some charge remaining on capacitors C3, C4. Such charges represent an offset adjustment which, if left on capacitors C3 and C4 for the next analog-to-digital conversion, would compensate for any offset and comparison error. Thus, the circuit 200 can be used to automatically nullify the effects of any offset and comparison error by simply executing a "dummy" analog-to-digital conversion to initialize the charges placed on capacitors C3 and C4 prior to performing an analog-to-digital conversion on actual pixel signals. This process is known as automatic nullification. During the "dummy" conversion, the output of the comparator at node B in step 308 does not need to be written to memory. Additionally, in a subsequent analog-to-digital conversion of a pixel signal, after starting at step 301, step 302 (i.e., resetting the integrator), should be skipped to avoid resetting the charges stored on capacitor C3 and C4 by the automatic nullification conversion, and execution should continue at step 303.

Figure 4:
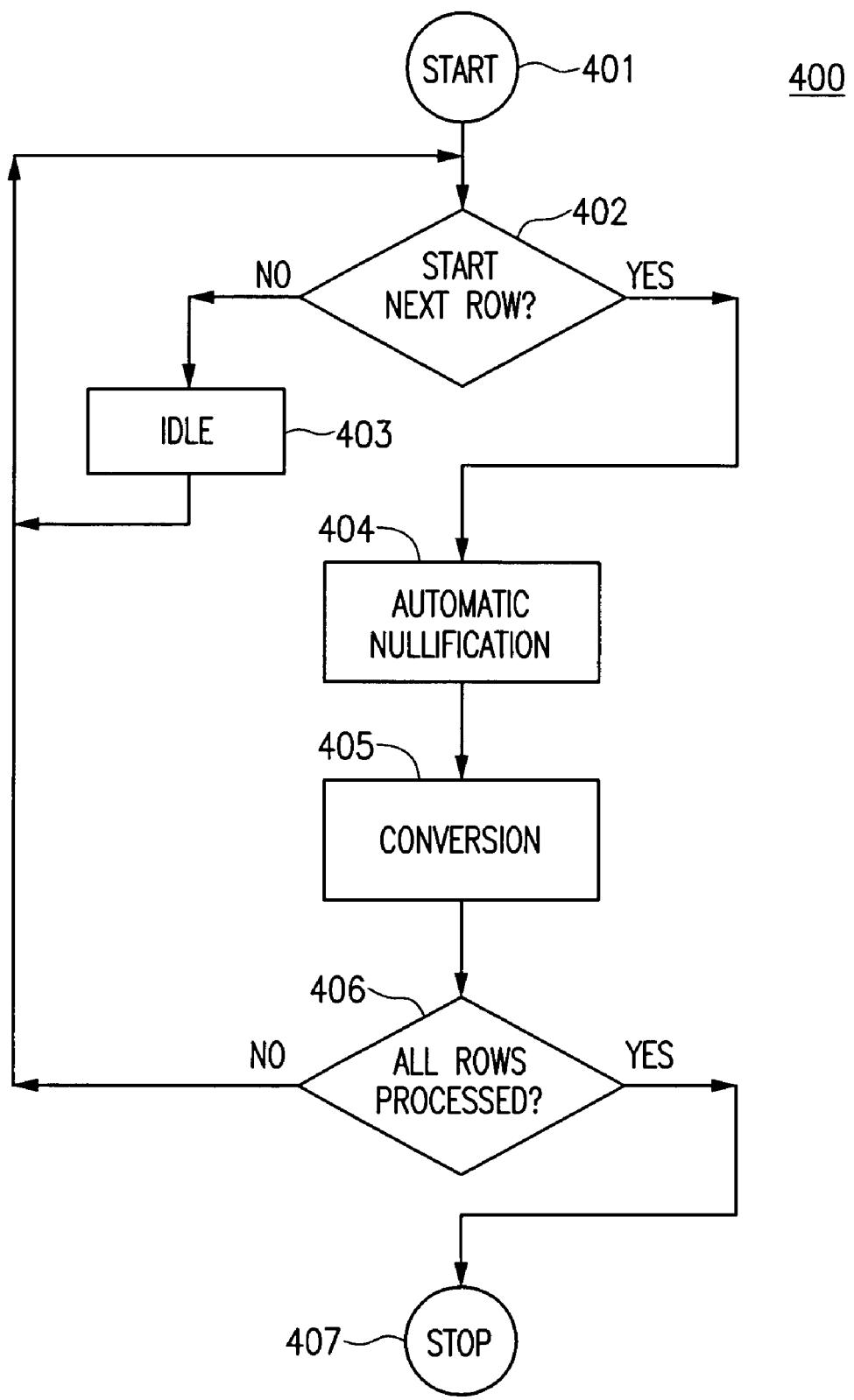
FIG. 4 is a flowchart illustrating a portion of the operations of an imager incorporating the circuit of the present invention.

Now referring to FIG. 4, a portion 400 of the processing performed by an imager 100 (FIG. 1) utilizing a plurality of circuits 200 (FIG. 2) in its column parallel ADC 160 is now described. The portion 400 of the process begins at step 401 and jumps immediately to step 402.

At step 402, the control circuit 150 (FIG. 1) checks to see whether it is time to process the next row of pixels. If it is not, execution continues at step 403. If it is time to process the next row of pixels, the next row of pixels is selected as the current row, and execution continues at step 404.

Step 403 is an idle task, so execution loops back to step 402.

At step 404, the automatic nullification processing described above is performed in each of the circuits 200 in the column parallel ADC 160. When completed, execution continues at step 405.

At step 405, the above described analog-to-digital conversion process is performed in each of the circuits 200 in the column driver 160. After the conversion has been completed, execution continues at step 406.

At step 406, it is determined whether every row of the pixel array 101 (FIG. 1) has been processed. If all rows have been processed, all the pixels have been processed, so execution proceeds to step 407, which ends the process 400. If there are more rows to processed, execution continues at step 402.

As described above with reference to FIG. 4, the circuit 200 of the invention is comprised of a voltage-to-charge converter 210, a charge integrator 220, and a comparison portion 230. The voltage-to-charge converter 210 accepts the reset Vrst and photo Vsig signals from a pixel at different times and stores charges corresponding to these signal on capacitors C1 and C2. The charge from capacitors C1 and C2 are supplied to the charge integrator 220. The charge integrator 220 is operated with the voltage-to-charge converter 210 and comparison portion 230 in an iterative manner to produce one bit of an analog-to-digital conversion of the pixel signal per iteration. Any offset signal present in the circuit 200 can be automatically compensated by the automatic nullification process, which uses left over charge in the charge integrator from a conversion on dummy data as a compensation factor for the offset signal.

Vertical binning can be achieved by repeating steps 304 for different selected rows. This causes the output of integrator 202 to output the sum of Vrst−Vsig from the selected binning rows.

Figure 5:
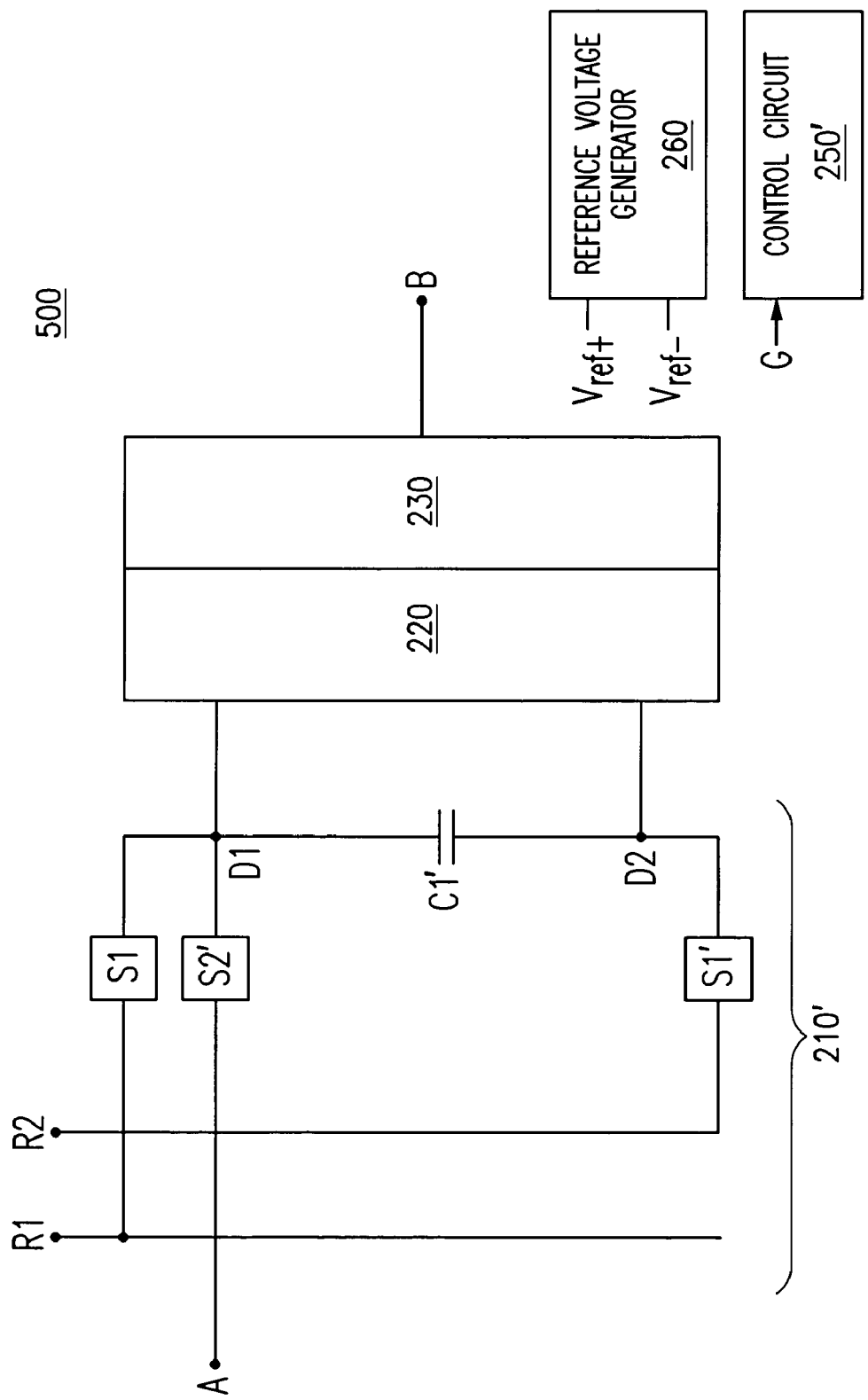
FIG. 5 illustrates a second embodiment of the present invention.

Now referring to FIG. 5, a circuit 500 in accordance with a second exemplary embodiment of the present invention is illustrated. The circuit 500 is includes the same reference voltage generator 260, charge integrator 210, and comparison portion 230 as circuit 200 (FIG. 2). The circuit 500, however, features a different voltage-to-charge converter 210' and is operated as described below by control circuit 250'.

Referring to FIGS. 2 and 5, new voltage-to-charge converter 210' substitutes a single capacitor C1' for the dual capacitors C1 and C2 of circuit 210. Without the need to support two capacitors, the circuit 210' does not need and no longer includes switches S3 and S4 from circuit 210. Since the circuit 210' can only supply a signal to the charge integrator 220 that corresponds to either the reset Vrst or photo Vsig signals at any given time, the circuit 500 operates somewhat differently from circuit 200. The reset signal Vrst is integrated in the charge integrator 220 while set to "add" mode and the photo signal Vsig is integrated in the charge integrator 220 while set to "subtract" mode. Alternatively, the circuit 500 stores the reset signal, and performs an analog-to-digital conversion of the reset signal, then stores the photo signal, and performs an analog-to-digital conversion of the photo signal. The two digital signals can then be subtracted digitally to yield the same result as that produced by circuit 200.

The voltage-to-charge converter 210' operates as follows. Initially, switches S1, S1', and switch S2' are in an open state. When either a reset Vrst or photo Vsig signal is present at node A, switches S1' and S2' are temporarily closed, thereby temporarily charging capacitor C1' to either Vrst or Vsig on one plate and Vref− on the other. Charge is stored at capacitor C1' while switches S1' and S2' are closed. When switches S1' and S2' are opened, the charge stored at capacitor C1' is decoupled from node A, and a signal at nodes D1 and D2 can be routed to the charge integrator 220.

Similarly, switch S2' can be in an open state while switches S1, S1' are temporarily closed, to permit the reference voltages Vref−, Vref+ respectively present at nodes R1 and R2 to be routed to different plates of capacitor C1'. When switches S1, S1' are opened, a signal corresponding to the reference voltages Vref−, Vref+ is present at nodes D1 and D2 and can be routed to the charge integrator 220.

The operation of circuit 500 is therefore similar in many respects to that of circuit 200. As the reset signal is output by a pixel to node A, the new charge integrator 210' is operated to store a charge corresponding to that signal on capacitor C1'. Then the circuit 220 is operated to integrate the reset signal Vrst in the same manner that circuit 200 is operated to integrate the signal corresponding to the difference between the reset and photo signals (i.e., Vrst−Vsig).

The reset signal Vrst will pass through switches S5 and S5' whereas the photo signal Vsig will pass through switches S6 and S6'.

Alternatively, the digital signal corresponding to the reset signal Vrst can be output at node B, one bit at a time and can be stored in a memory. The same process can then be repeated for the photo signal Vsig. The two digital signals can then be subtracted in the digital domain to yield the same result as which would be produced by circuit 200.

One consequence of performing two integration cycles is that a programmable gain feature can be implemented in circuit 500. That is, a programmable gain value G, where G is a positive integer, can be applied to the final digital output when circuit 500 is used. The programmable gain feature can be enabled by repeatedly presenting the signals at node D1 and D2 corresponding to the reset signal Vrst during the first loop iteration and then performing the above described integration of the (now repeated) reset signal. The amount of repetition is equal to the desired gain level G. The same repetitive process is performed with respect to the photo signal Vsig. Alternatively, in order to support binning, during each repetition the reset and photo signals may be supplied from different rows of pixels. The repetition causes the first and second conversions respectively produce a signal stored on capacitors C3 and C4 corresponding to G times the reset signal (G*Vrst) minus G times the photo signal (G*Vsig). Thus, the method yields a signal equivalent to G times the difference between the reset Vrst and photo Vsig signals (i.e., G*(Vrst−Vsig)).

Figure 6:
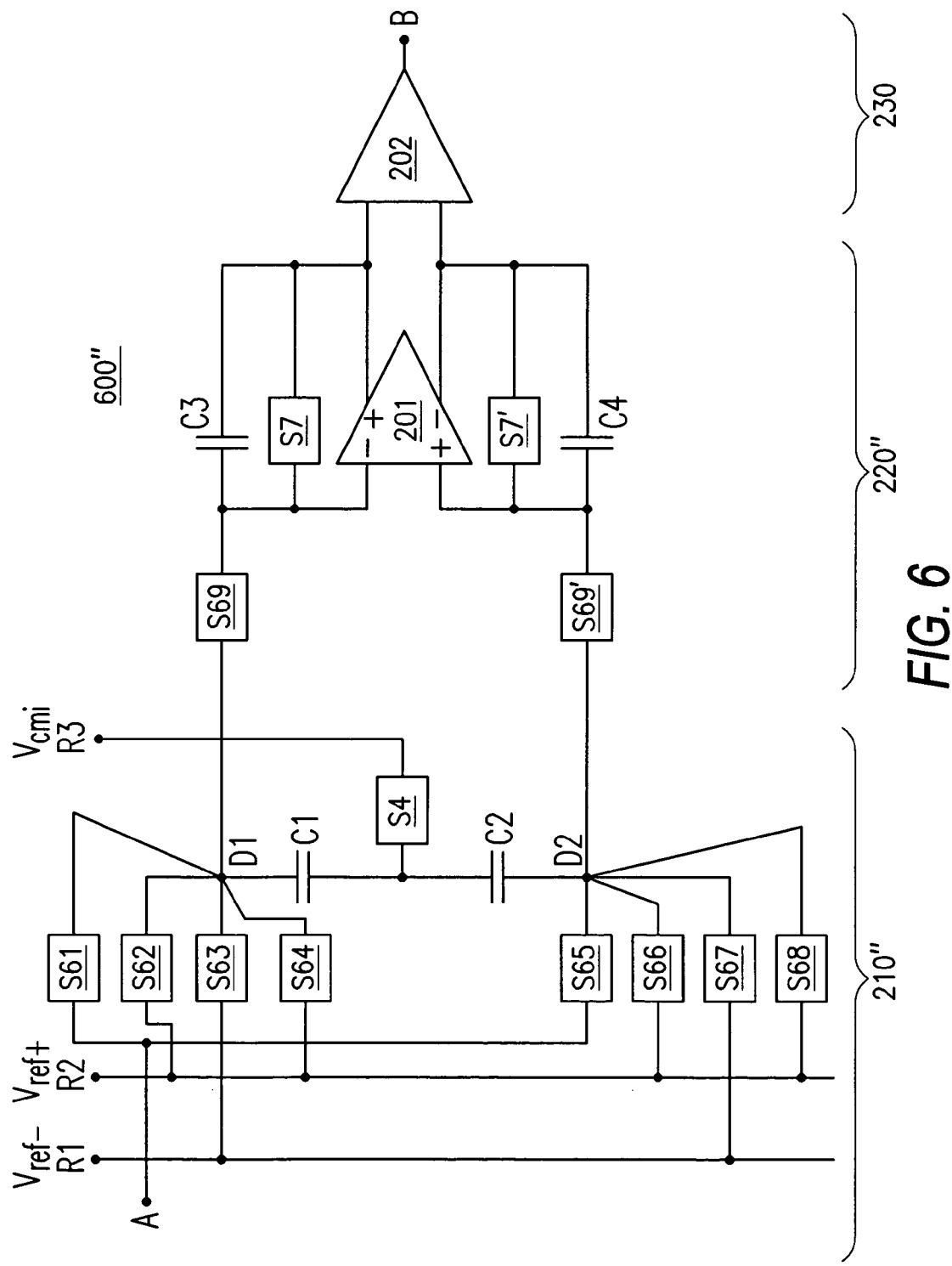
FIG. 6 illustrates a third embodiment of the present invention.

FIG. 6 illustrates a circuit 600 which is an alternate embodiment of the circuit 200 of FIG. 2. The circuit of FIG. 6 includes a new voltage-to-charge converter 210" and a new charge integrator 220". The new voltage-to-charge converter 210" includes new switches S61, S62, S63, S64, S65, S66, S67, and S68. The switches can be operated to supply at nodes D1 and D2 with the reset Vrst or pixel Vsig signals from node A, or the reference voltages Vref− and Vref+ respectively from nodes R1 and R2. In particular, the switches can be configured to provide the reference voltages at different orientations with respect to node D1. For example, reference voltages Vref+ and Vref− can be respectively supplied to nodes D1 and D2. Alternatively, reference voltages Vref+ and Vref− can also be respectively supplied to nodes D2 and D1.

The new charge integrator 220" include switches S69 and S69' which can be used to controllably couple the amplifier 201 and capacitors C3, C4 to the voltage-to-charge converter 210".

In the embodiment illustrated in FIG. 6, the charge integrator is not changed in configuration between an "add" mode and a "subtract" mode because the voltage-to-charge converter 210" can be configured to reverse, as necessary, the polarity of the reference voltages Vref+, Vref− to effectively cause the charge integrator to add or subtract the reference voltage from the voltages across capacitors C3 and C4.

Figure 7:
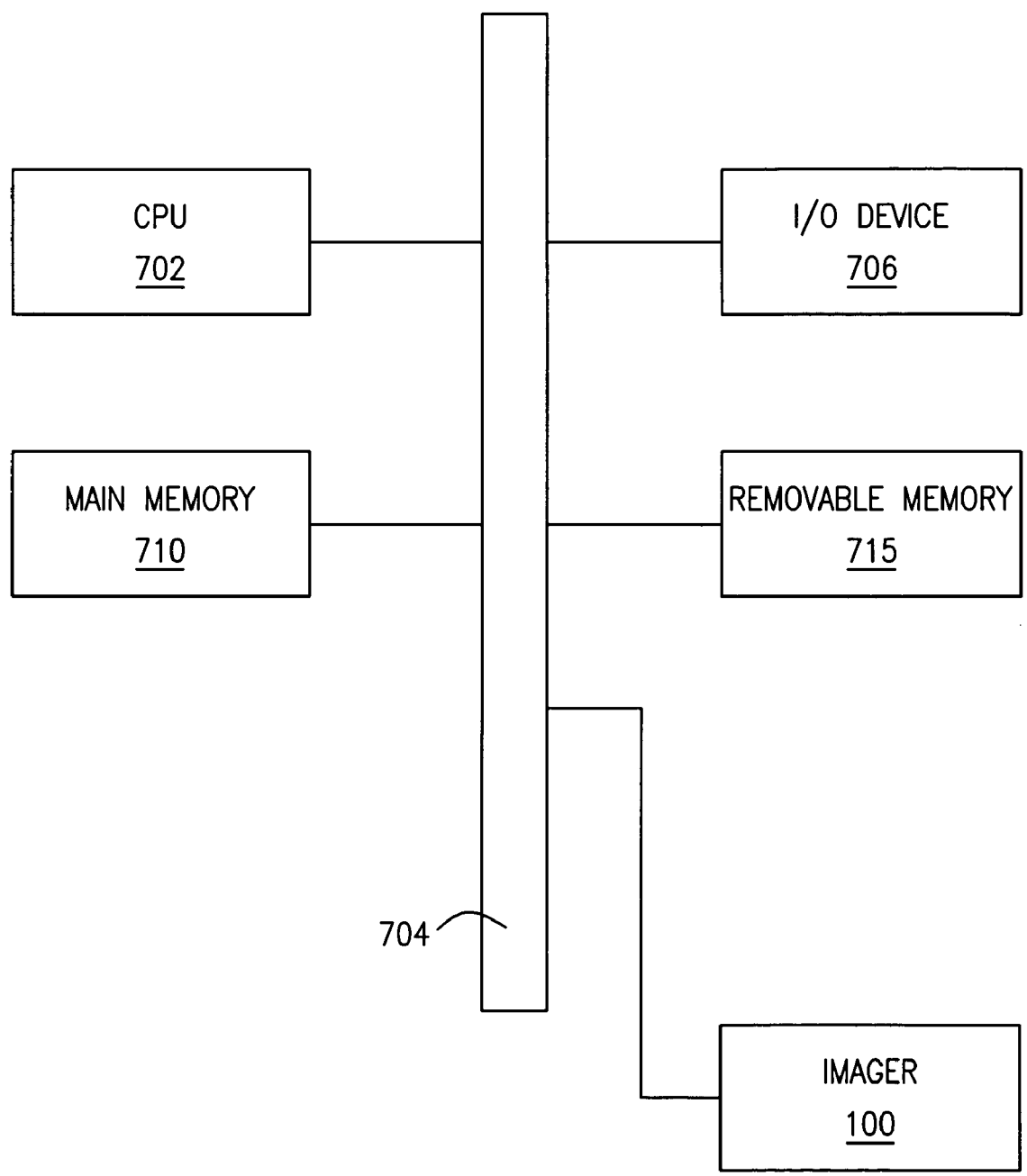
FIG. 7 illustrates a system with an imager having an embodiment of the circuit of the present invention.

FIG. 7 shows system 700, a typical processor system modified to include an imager 100 incorporating the circuit 200, 500, or 600 of the present invention. The imager 100 may have pixels 102 which are either CMOS based pixels or CCD based pixels. The processor-based system 700 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and data compression system.

System 700, for example a camera system, generally comprises a central processing unit (CPU) 702, such as a microprocessor, that communicates with an input/output (I/O) device 706 over a bus 704. Imager 100 also communicates with the CPU 702 over the bus 704. The processor-based system 700 also includes a memory, for example random access memory (RAM) 710, and can include removable memory 715, such as flash memory, which also communicate with the CPU 702 over the bus 704. The imager 100 may be combined with a processor, such as a CPU, digital signal processor, or microprocessor, with or without memory storage on a single integrated circuit or on a different chip than the processor.

While the invention has been described in detail in connection with the exemplary embodiments, it should be understood that the invention is not limited to the above disclosed embodiments. Rather, the invention can be modified to incorporate any number of variations, alternations, substitutions, or equivalent arrangements not heretofore described, but which are commensurate with the spirit and scope of the invention. Accordingly, the invention is not limited by the foregoing description or drawings, but is only limited by the scope of the appended claims.

The invention claimed is:

1. A method for converting a target analog signal to a target digital signal comprising:
   resetting an internal state of an analog-to-digital converter to an initial value;
   performing a first conversion with the analog-to-digital converter on a first analog signal to produce a first digital signal, wherein said internal state is changed during the course of said first conversion;
   performing a second conversion with the analog-to-digital converter on the target analog signal to produce a second digital signal; and
   outputting the second digital signal as the target digital signal;
   wherein said internal state is maintained between a completion of said first conversion and a start of said second conversion.

2. The method of claim 1, wherein said target analog signal comprises a reset signal received from a pixel followed by a photo signal received from said pixel.

3. The method of claim 2, wherein:
   said step of performing a second conversion is performed while said target analog signal corresponds to said reset signal,
   said step of outputting is performed when said target digital signal is a digital representation of said reset signal, and
   said method further comprises:
      performing a third conversion with the analog-to-digital converter on the target analog signal, while said target analog signal corresponds to said photo signal, to produce a third digital signal; and
      outputting the third digital signal as a second target digital signal as a digital representation of said photo signal.

4. The method of claim 3, further comprising:
   outputting a final digital signal equal to a difference between said first and second target digital signals, wherein said difference is digitally calculated.

5. The method of claim 1, wherein said internal state is maintained as a charge in a charge integrator of said analog-to-digital value and said step of resetting said internal state comprises setting said charge to a default value.

6. The method of claim 5, wherein said default value corresponds to a zero charge level.

7. The method of claim 1, wherein the first analog signal is an analog signal present at an input of the analog-to-digital converter when starting said first conversion.

8. The method of claim 7, wherein said first analog signal is a dummy signal.

9. The method of claim 7, wherein the first analog signal is the target analog signal.

10. The method of claim 1, wherein said internal state is maintained as a charge on a capacitor, said capacitor having a first plate and a second plate, and said step of resetting said internal state comprises temporarily coupling together said first and second plates.

11. The method of claim 1, wherein said target analog signal comprises a reset signal received from a pixel followed by a photo signal received from said pixel, and said step of performing a second conversion comprises:
   storing a first charge on a first capacitor while said target analog signal corresponds to said reset signal;
   storing a second charge on a second capacitor while said target analog signal corresponds to said photo signal; and
   converting said first and second charge into a single digital signal.

12. A method for performing a plurality of simultaneous analog-to-digital conversions using a respective plurality of analog-to-digital converters, the method comprising:
   calibrating each analog-to-digital converter to produce a same digital output for a same analog input;
   receiving, at each analog-to-digital converter, a respective plurality of target analog signals;
   converting, at each analog-to-digital converter, the respective plurality of target analog signals to a corresponding plurality of target digital signals;
   wherein said calibrating step comprises, at each analog-to-digital converter:
      setting an internal state used in performing an analog-to-digital conversion to an initial value;
      changing the internal state to an altered internal state by performing an initial analog-to-digital conversion on any analog signal; and
      maintaining the altered internal state between an end of said initial analog-to-digital conversion and a start of said converting.

13. The method of claim 12, wherein said step of setting an internal state comprises:
   setting a charge maintained in a charge integrator portion of each analog-to-digital converter to a default value.

14. The method of claim 13, further comprising:
   receiving a programmable gain level;
   wherein said step of receiving, at each analog-to-digital converter, a respective plurality of target analog signals, is performed a number of times equal to said programmable gain level before said step of converting.

15. The method of claim 14, wherein for each repetition of said step of receiving, said plurality of target analog signals is received from different pixels.

16. The method of claim 13, wherein said default value corresponds to a zero charge level.

17. The method of claim 12, wherein said step of setting an internal state comprises:

in each analog-to-digital converter, temporarily coupling together both plates of each capacitor used to maintain said internal state as a charge level.

18. A method for converting analog signals output by a pixel into a corresponding target digital signal, comprising:
calibrating an analog-to-digital converter;
converting an analog reset signal from the pixel into a first charge;
converting an analog photo signal from the pixel into a second charge;
creating a differential analog pixel signal from the first and second charge; and
performing a target analog-to-digital conversion of the differential analog pixel signal to produce the target digital signal;
wherein said calibrating step comprises:
resetting a charge stored in a charge integrator of said analog-to-digital converter to an initial state;
performing an initial analog-to-digital conversion of an analog signal, wherein said initial analog-to-digital conversion alters the charge stored in the charge integrator; and
maintaining said charge stored in said charge integrator between an end of said initial analog-to-digital conversion and a start of said target analog-to-digital conversion.

19. A method for converting analog signals output by a pixel into a target digital signal, comprising:
calibrating an analog-to-digital converter;
performing a first analog-to-digital conversion of an analog reset signal output by said pixel to produce a first digital signal;
performing a second analog-to-digital conversion of an analog photo signal output by said pixel to produce a second digital signal; and
calculating the target digital signal as a difference between said first and second digital signals;
wherein said step of calibrating comprises:
resetting a charge stored in a charge integrator of said analog-to-digital converter to an initial state;
performing an initial analog-to-digital conversion of an analog signal, wherein said initial analog-to-digital conversion alters said charge stored in said charge integrator; and
maintaining said charge stored in said charge integrator between an end of said initial analog-to-digital conversion and a start of said first analog-to-digital conversion.

20. An analog-to-digital converter, comprising:
a voltage-to-charge circuit, for accepting an input signal, accepting a plurality of reference voltages, and for storing said input signal and reference voltages as charge;
a charge integrator, coupled to said voltage-to-charge circuit, for changing a charged based state by adding or subtracting charge received from said voltage-to-charge circuit; and
a comparison circuit, coupled to an output of said charge integrator, for producing a digital output based said charged based state.

21. The analog-to-digital converter of claim 20, wherein said voltage-to-charge circuit comprises:
a plurality of capacitors, each of said capacitors having a first plate and a second plate;
a signal input node, for receiving an input signal;
a plurality of reference nodes, for receiving a plurality of reference voltages;
a plurality of switches;
wherein said plurality of switches controllable to assume one of:
a first state such that said first plates of each said capacitor is coupled to said signal input node, or
a second state such that said first plates of each said capacitor is respectively coupled to said plurality of reference nodes.

22. The analog-to-digital converter of claim 21, further comprising:
a reference voltage generator;
wherein:
said reference voltage generator supplies a first reference voltage to a first one of said plurality of reference nodes,
said reference voltage generator supplies a second reference voltage to a second one of said plurality of reference nodes, and
said second reference voltage has an opposite polarity with respect to said first reference voltage.

23. The analog-to-digital converter of claim 22, wherein said first and second reference voltages have a same magnitude but are of opposite polarities.

24. The analog-to-digital converter of claim 20, wherein said voltage-to-charge circuit comprises:
a capacitor, said having a first plate and a second plate;
a signal input node, for receiving an input signal;
a plurality of reference nodes, for receiving a plurality of reference voltages;
a plurality of switches;
wherein said plurality of switches controllable to assume one of:
a first state such that said first plate of said capacitor is coupled to said signal input node, or
a second state such that said first plate of said capacitor is coupled to a first one of said plurality of reference nodes and said second plate of said capacitor is coupled to a second one of said plurality of reference nodes.

25. The analog-to-digital converter of claim 24, further comprising:
a reference voltage generator;
wherein
said reference voltage generator supplies a first reference voltage to said first one of said plurality of reference nodes,
said reference voltage generator supplies a second reference voltage to
said second one of said plurality of reference nodes, and
said second reference voltage has an opposite polarity with respect to said first reference voltage.

26. The analog-to-digital converter of claim 25, wherein said first and second reference voltages have a same magnitude but are of opposite polarities.

27. The analog-to-digital converter of claim 20, wherein said charge integrator comprises:
an amplifier; and
a feedback network, said feedback network coupled to said amplifier and comprising:
a plurality of feedback capacitors; and
a plurality of feedback control switches, wherein said plurality of feedback control switches can be configured to cause said amplifier to add or subtract charge coupled to an input of said amplifier to charge stored on said plurality of feedback capacitors;

wherein said amplifier adds or subtracts charge coupled to said input based on a signal from said comparison circuit.

28. The analog-to-digital converter of claim 27, wherein said comparison circuit comprises a comparator, said comparator having a plurality of inputs coupled to a plurality of outputs of said amplifier and said feedback network.

29. An imager, comprising:
a pixel array, comprising:
a plurality of pixels arranged in a plurality of rows and a plurality of columns;
row circuitry, coupled to said pixel array, for selecting an activated row of said pixel array;
column circuitry, coupled to said pixel array, for receiving in parallel, signals from each pixel of said activated row, and for converting said signals into digital signals, said column circuitry comprising a plurality of analog-to-digital converters, each of said analog-to-digital converters comprising:
a voltage-to-charge circuit, for accepting an input signal, accepting a plurality of reference voltages, and for storing said input signal and reference voltages as charge;
a charge integrator, coupled to said voltage-to-charge circuit, for changing a charged based state by adding or subtracting charge received from said voltage-to-charge circuit; and
a comparison circuit, coupled to an output of said charge integrator, for producing a digital output based said charged based state; and
a control circuit, coupled to said row circuitry and said column circuitry, for operating said row circuitry to select said activated row and for operating said column circuitry to perform said converting.

30. The imager of claim 29, wherein each said voltage-to-charge circuit comprises:
a plurality of capacitors, each of said capacitors having a first plate and a second plate;
a signal input node, for receiving an input signal;
a plurality of reference nodes, for receiving a plurality of reference voltages;
a plurality of switches;
wherein said plurality of switches controllable to assume one of:
a first state such that said first plates of each said capacitor is coupled to said signal input node, or
a second state such that said first plates of each said capacitor is respectively coupled to said plurality of reference nodes.

31. The imager of claim 30, further comprising:
a reference voltage generator;
wherein:
said reference voltage generator supplies a first reference voltage to a first one of said plurality of reference nodes,
said reference voltage generator supplies a second reference voltage to a second one of said plurality of reference nodes, and
said second reference voltage has an opposite polarity with respect to said first reference voltage.

32. The imager of claim 31, wherein said first and second reference voltages have a same magnitude but are of opposite polarities.

33. The imager of claim 29, wherein each said voltage-to-charge circuit comprises:
a capacitor, said having a first plate and a second plate;
a signal input node, for receiving an input signal;
a plurality of reference nodes, for receiving a plurality of reference voltages;
a plurality of switches;
wherein said plurality of switches are controllable to assume one of:
a first state such that said first plate of said capacitor is coupled to said signal input node, or
a second state such that said first plate of said capacitor is coupled to a first one of said plurality of reference nodes and said second plate of said capacitor is coupled to a second one of said plurality of reference nodes.

34. The imager of claim 33, further comprising:
a reference voltage generator;
wherein
said reference voltage generator supplies a first reference voltage to said first one of said plurality of reference nodes,
said reference voltage generator supplies a second reference voltage to said second one of said plurality of reference nodes, and
said second reference voltage has an opposite polarity with respect to said first reference voltage.

35. The imager of claim 34, wherein said first and second reference voltages have a same magnitude but are of opposite polarities.

36. The imager of claim 29, wherein each said charge integrator comprises:
an amplifier; and
a feedback network, said feedback network coupled to said amplifier and comprising:
a plurality of feedback capacitors; and
a plurality of feedback control switches, wherein said plurality of feedback control switches can be configured to cause said amplifier to add or subtract charge coupled to an input of said amplifier to charge stored on said plurality of feedback capacitors;
wherein said amplifier adds or subtracts charge coupled to said input based on a signal from said comparison circuit.

37. The imager of claim 36, wherein each said comparison circuit comprises a comparator, said comparator having a plurality of inputs coupled to a plurality of outputs of said amplifier and said feedback network.

38. An imaging system, comprising:
a processor based subsystem; and
an imager, said imager coupled to said processor based subsystem, said imager comprising:
a pixel array, comprising:
a plurality of pixels arranged in a plurality of rows and a plurality of columns;
row circuitry, coupled to said pixel array, for selecting an activated row of said pixel array;
column circuitry, coupled to said pixel array, for receiving in parallel, signals from each pixel of said activated row, and for converting said signals into digital signals, said column circuitry comprising a plurality of analog-to-digital converters, each of said analog-to-digital converters comprising:
a voltage-to-charge circuit, for accepting one of said signals as an input signal, accepting a plurality of reference voltages, and for storing said input signal and reference voltages as charge;
a charge integrator, coupled to said voltage-to-charge circuit, for changing a charged based state by adding or subtracting charge received from said voltage-to-charge circuit; and a comparison circuit, coupled to an output of said charge integrator, for producing a digital output based said charged based state; and a control circuit, coupled to said row circuitry and said column circuitry, for operating said row circuitry to select said activated row and for operating said column circuitry to perform said converting.

39. The imaging system of claim 38, wherein in each of said analog-to-digital converters, said voltage-to-charge circuit comprises:

a plurality of capacitors;

a plurality of input nodes for receiving an input signal and a plurality of reference voltages; and a plurality of switches for selectively coupling said input nodes to said plurality of capacitors.

40. The imaging system of claim 39, wherein in each of said analog-to-digital converters, said voltage-to-charge circuit further comprises:

a crowbar switch, for coupling a plate of a first capacitor from said plurality of capacitors to a plate from a second capacitor from said plurality of capacitors.

41. The imaging system of claim 38, wherein in each of said analog-to-digital converters, said charge integrator comprises:

an amplifier; and a feedback network, said feedback network coupled to said amplifier and comprising:

a plurality of feedback capacitors; and a plurality of feedback control switches, wherein said plurality of feedback control switches can be configured to cause said amplifier to add or subtract charge coupled to an input of said amplifier to charge stored on said plurality of feedback capacitors.

42. The imaging system of claim 41, wherein in each of said analog-to-digital converters, said comparison circuit comprises a comparator, said comparator having a plurality of inputs coupled to a plurality of outputs of said amplifier and said feedback network.

43. The imaging system of claim 38, wherein in each of said analog-to-digital converters, said voltage-to-charge circuit comprises:

a capacitor;

a plurality of input nodes for receiving an input signal and a plurality of reference voltages; and a plurality of switches for selectively coupling said input nodes to said capacitor.

* * * * *